United States Patent
Tseng

(10) Patent No.: US 6,797,574 B2
(45) Date of Patent: Sep. 28, 2004

(54) METHOD OF FABRICATING W/TIN GATE FOR MOSFETS

(75) Inventor: Horng-Huei Tseng, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 10/623,203

(22) Filed: Jul. 18, 2003

(65) Prior Publication Data

US 2004/0018691 A1 Jan. 29, 2004

Related U.S. Application Data

(62) Division of application No. 09/999,577, filed on Nov. 1, 2001.

(51) Int. Cl.⁷ .............................................. H01L 21/336
(52) U.S. Cl. ....................... 438/301; 438/302; 438/303; 438/305; 438/364
(58) Field of Search ................................ 438/301–303, 438/305, 364, 372

(56) References Cited

U.S. PATENT DOCUMENTS 6,225,168 B1 * 5/2001 Gardner et al. .............. 438/287

* cited by examiner

*Primary Examiner*—Hsien Ming Lee
(74) *Attorney, Agent, or Firm*—Duane Morris LLP

(57) ABSTRACT

A dielectric layer is etched to form an opening in dielectric layer. A gate oxide layer is formed on semiconductor substrate in said opening. A barrier conductor is formed along the surface of the opening. A metal layer is formed on the barrier conductor and refilled into the opening. A portion of the metal layer and the barrier conductor is removed to form a gate for said transistor. The dielectric layer is removed. The barrier conductor is removed on sidewall of the gate. Lightly doped drain region is formed in the semiconductor substrate. Next, Sidewall spacer is formed on sidewall of the gate. Then, source and drain is formed in the semiconductor substrate by ion implantation using the gate and spacer as masking.

14 Claims, 2 Drawing Sheets

METHOD OF FABRICATING W/TIN GATE FOR MOSFETS

This application is a divisional of U.S. application Ser. No. 09/999,577 filed on Nov. 1, 2001.

FIELD OF INVENTION

The present invention relates to a semiconductor device, and more specifically, to a method of fabricating a metal oxide semiconductor field effect transistor (MOSFET) for used in deep sub-micron meter range.

BACKGROUND OF THE INVENTION

The semiconductor industry has been advanced in an ever brisk pace, recently. In order to achieve high performance integrated circuits or high package density of a wafer, the sizes of semiconductor devices have become smaller and smaller than before in the field of Ultra Large Scale Integrated (ULSI) technologies. The semiconductor industry has been advanced to the field of Ultra Large Scale Integrated (ULSI) technologies. The fabrication of the metal-oxide-semiconductor transistor also follows the trend. As the size of the devices is scaled down, silicon based nano-scale electronics have been attention for these years. For example, single-electron-tunneling devices are developed in recent years.

Integrated circuits includes more than millions devices in a specific area of a wafer and electrically connecting structure for connecting these devices to perform desired function. One of the typical devices is metal oxide semiconductor field effect transistor (MOSFET). The MOSFET has been widely, traditionally applied in the semiconductor technologies. As the trend of the integrated circuits, the fabrication of the MOSFET also meets various issues to fabricate them. The typically issue that relates to hot carriers injection is overcame by the development of lightly doped drain (LDD) structure.

Further, the requirement of the devices towards high operation speed and low operation power. For deep sub-micron meter MOS devices, the self-aligned silicide (SALICIDE) contact, ultra-shallow source and drain junction are used for improving the operation speed and short channel effect. In another research by T. Yoshitomi, he develops a high performance CMOS with good control of short channel effect and silicide resistance. Please see "High Performance 0.15 $\mu$m Single Gate Co Salicide CMOS, T. Yoshitomi et al., 1996, Symposium on VLSI Technology Digest of Technical papers". The $CoSi_2$, NiSi have been used for deep sub-micron high speed CMOS due to the low sheet resistance of fine silicide line. However, it is difficult to make ultra-shallow junction and form SALICIDE contact without degrading the device performance.

The requirement of the ULSI CMOS technology is the need of devices operated at low supply voltage and they have high speed. When the supply-voltage is reduced, the threshold voltage needs to be scaled down to achieve the desired circuit switching speed. IBM has proposed that CMOS employs non-uniform channel doping profiles and ultra-shallow source and drain extensions and halos, which can be referenced in "CMOS technology scaling 0.1 $\mu$m and beyond, IBM semiconductor research and development center, Bijan Davari, 1996, IEDM, 96–555". For the high performance case, the threshold voltage is scaled down less than the supply voltage in order to maintain a reasonable standby current.

U.S. Pat. No. 6,261,934 which assigned to Texas Instruments Incorporated (Dallas, Tex.), entitled "Dry etch process for small-geometry metal gates over thin gate dielectric" discloses a structure for semiconductor device. As geometries shrink into the deep submicron regime (below 0.5 or 0.35 micron), such buried channels become very undesirable. Thus one of the constraints on new gate materials is a good work-function match to the semiconductor used. Titanium nitride is a very promising candidate for gate electrode material. It has a work function near the mid-gap point of silicon (4.65 eV) and eliminates gate depletion effects. However, titanium nitride has a quite high resistivity (120 m.OMEGA.-cm), and therefore needs to be used in conjunction with a material with higher conductivity for low interconnect delays to be achieved. For that purpose, tungsten (resistivity of 8 m.OMEGA.-cm) has been used.

SUMMARY OF THE INVENTION

The method of the present invention includes forming a dielectric layer on said semiconductor substrate. A dielectric layer is etched to form an opening in dielectric layer. A gate oxide layer is formed on semiconductor substrate in said opening. A barrier conductor is formed along the surface of the opening. A metal layer is formed on the barrier conductor and refilled into the opening. A portion of the metal layer and the barrier conductor is removed to form a gate for said transistor. The dielectric layer is removed. The barrier conductor is removed on sidewall of the gate. Lightly doped drain region is formed in the semiconductor substrate. Next, Sidewall spacer is formed on sidewall of the gate. Then, source and drain is formed in the semiconductor substrate by ion implantation using the gate and spacer as masking.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention proposes a novel method to fabricate a W/Si gate for MOSFETS. In the present invention, the technology can increase the device performance.

In a preferred embodiment, a single crystal silicon substrate 2 with a <100> crystallographic orientation is provided. Thick field oxide (FOX) regions or shallow trench isolation are formed to provide isolation between devices on the substrate. In a case, the FOX regions can be formed via lithography and etching steps to etch a silicon nitride-silicon dioxide composition layer. After the photoresist is removed and wet cleaned, thermal oxidation in steam environment is used to grow the FOX regions 4 to a thickness of about 3000–8000 angstroms. The FOX regions 4 can be replaced by a plurality of shallow trench isolations, as well known in the art.

Figure 1:
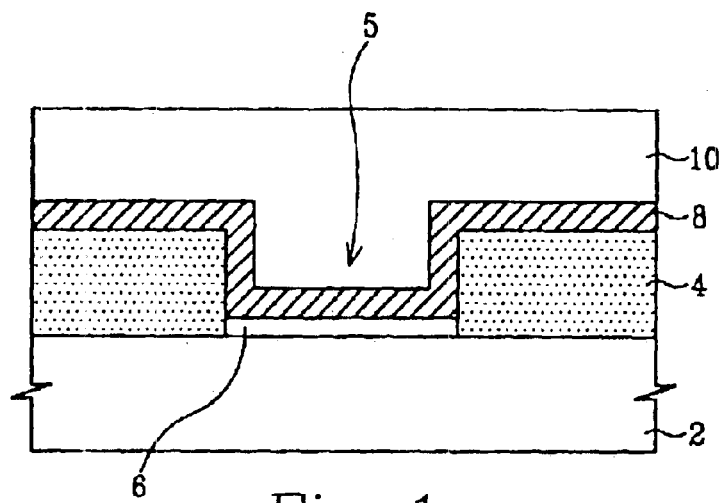
FIG. 1 is a cross section view of a semiconductor wafer illustrating the steps of forming a dielectric layer, a barrier conductor and metal layer on a semiconductor substrate according to the present invention.

A first dielectric layer 4 is then formed over the substrate 2 using a low-pressure chemical vapor deposition process. In preferred embodiment, the first dielectric layer 4 is formed of oxide, nitride, oxynitride or the combination thereof. Turning to FIG. 1, next, standard lithography and etching steps are used to etch the first dielectric layer 4 to form an opening 5 for exposing the substrate 2. The gate oxide layer 6 is formed after the step by thermal oxidation. A silicon dioxide layer 6 is formed on the top surface of the substrate 2 to serve as a gate oxide of a subsequently formed MOSFET. Typically, the silicon dioxide layer 6 is formed in an oxygen ambient at a temperature of about 800 to 1100 centigrade degrees. In the embodiment, the thickness of the silicon dioxide layer 6 is approximately 15–250 angstroms. Alternatively, the oxide layer 6 may be formed using any suitable oxide chemical compositions and procedures, such as chemical vapor deposition.

Subsequently, a barrier conductor (Titanium nitride) 8 is formed on the first dielectric layer 4 and along the surface of the opening 5, preferably, the barrier conductor 8 is formed of TiN. Then, a metal layer 10 is formed on the barrier conductor 8 and refilled into the opening 5. In a preferred embodiment, the metal layer 10 is formed of titanium, tungsten, aluminum, or copper.

Figure 2:
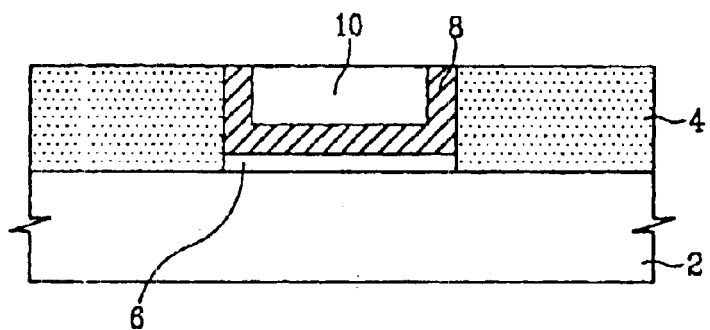
FIG. 2 is a cross section view of a semiconductor wafer illustrating the step of forming a gate structure according to the present invention.

Next, a chemical mechanical polishing is used to remove the barrier conductor 8 and metal layer 10 to the surface of the first dielectric layer 4 for forming the gate, as shown in FIG. 2.

Figure 3:
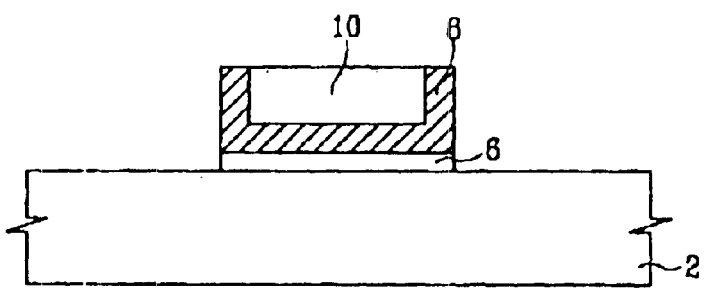
FIG. 3 is a cross section view of a semiconductor wafer illustrating the step of removing the dielectric layer according to the present invention.
Figure 4:
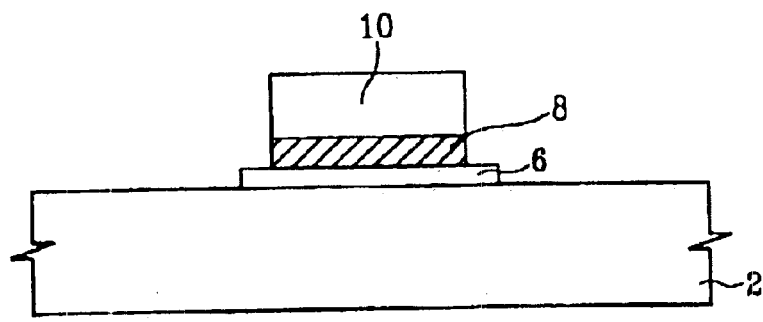
FIG. 4 is a cross section view of a semiconductor wafer illustrating the step of removing the TiN according to the present invention.

Turning to FIG. 3, the first dielectric layer 4 is removed by hot phosphorus, BOE or HF solution depending on the material for forming the first dielectric layer 4. An isotropical etching is used to remove the Titanium nitride 8 attached on the tungsten gate 10 as shown in FIG. 4. The plasma-etching recipe may include $O_2+C_2F_6$. U.S. Pat. No. 6,261,934 disclosed the method to etch the Titanium nitride 8. The step may be omitted. If the TiN does not be removed, oblique (titled) angle ion implantation such as LATIPS (large tilt-angle implanted punch-through stopper) may be used for forming the LDD.

Figure 5:
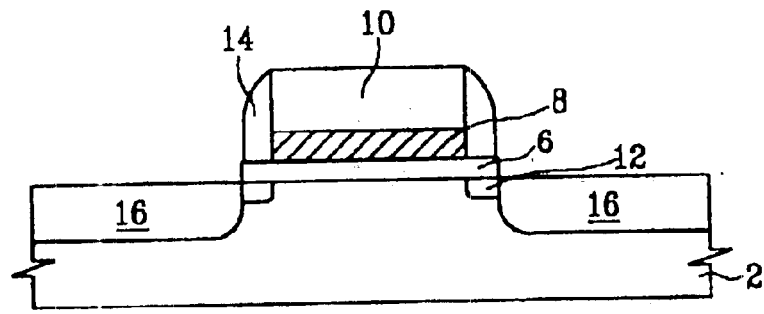
FIG. 5 is a cross section view of a semiconductor wafer illustrating the step of forming LDD and source and drain according to the present invention.

Please turn to FIG. 5, lightly doped drain regions 12 are formed by using ion implantation. Next, spacer 14 is formed on the sidewall of the gate 10. The step can be achieved by forming a dielectric layer then etching the layer. Finally, source and drain 16 are created by ion implantation using the gate 10 and space 14 as the masking.

Figure 6:
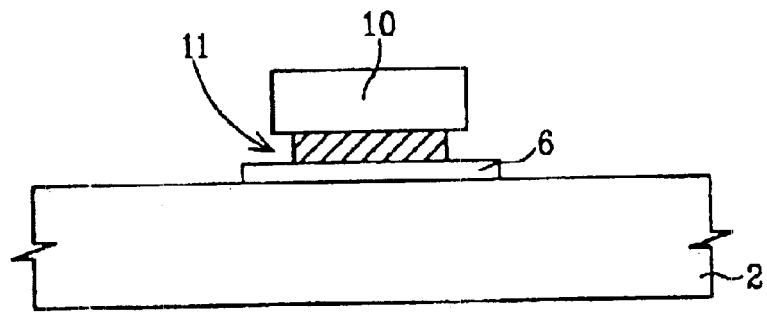
FIG. 6 is a cross section view of a semiconductor wafer illustrating another structure according to the present invention.

Another structure after the sidewall TiN is striped is shown in FIG. 6. It has to be noted that the structure include under cut portion 11 under the gate 10. After the spacer is formed, the LDD structure may be formed by using oblique rotation ion implantation such as LATIPS (large tilt-angle implanted punch-through stopper) technique. The LATIPS transistor employs a large tilt-angle implanted punch-through stopper (LATIPS). This implant forms higher concentration doped regions under the gate to prevent bulk punch-through.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method for manufacturing a transistor on a semiconductor substrate, said method comprising the steps of:

forming a dielectric layer on said semiconductor substrate;

etching said dielectric layer to form an opening in said dielectric layer;

forming a gate oxide layer on said semiconductor substrate in said opening;

forming a barrier conductor along the surface of said opening;

forming a metal layer on said barrier conductor and refilled into said opening;

removing a portion of said metal layer and said barrier conductor to form a gate for said transistor;

removing said dielectric layer;

stripping said barrier conductor on sidewall of said gate;

forming lightly doped drain region in said semiconductor substrate;

forming sidewall spacer on sidewall of said gate; and forming source and drain in said semiconductor substrate by ion implantation using said gate and spacer as masking.

2. The method of claim 1, wherein said dielectric layer comprises silicon oixde, silicon oxynitride or silicon nitride.

3. The method of claim 1, wherein said barrier conductor comprises titanium nitride, tungsten, aluminum or copper.

4. The method of claim 1, wherein said metal layer comprises titanium.

5. A method for manufacturing a transistor on a semiconductor substrate, said method comprising the steps of:

forming a dielectric layer on said semiconductor substrate;

etching said dielectric layer to form an opening in said dielectric layer;

forming a gate oxide layer on said semiconductor substrate in said opening;

forming a barrier conductor along the surface of said opening;

forming a metal layer on said barrier conductor and refilled into said opening;

removing a portion of said metal layer and said barrier conductor to form a gate for said transistor;

removing said dielectric layer;

forming lightly doped drain region in said semiconductor substrate by titled angle ion implantation;

forming sidewall spacer on sidewall of said gate; and forming source and drain in said semiconductor substrate by ion implantation using said gate and spacer as masking.

6. The method of claim 5, wherein said dielectric layer comprises silicon oixde, silicon oxynitride, or silicon nitride.

7. The method of claim 5, wherein said barrier conductor comprises titanium nitride, tungsten, aluminum or copper.

8. The method of claim 5, wherein said metal layer comprises titanium.

9. The method of claim 5, wherein said titled angle ion implantation comprises LATIPS (large tilt-angle implanted punch-through stopper) technique.

10. A method for manufacturing a transistor on a semiconductor substrate, said method comprising the steps of:
   forming a dielectric layer on said semiconductor substrate;
   etching said dielectric layer to form an opening in said dielectric layer;
   forming a gate oxide layer on said semiconductor and substrate in said opening;
   forming a barrier conductor along the surface of said opening;
   forming a metal layer on said barrier conductor and refilled into said opening;
   removing a portion of said metal layer and said barrier conductor to form a gate for said transistor;
   removing said dielectric layer;
   stropping said stripping said barrier conductor on sidewall of said gate and forming under cut under said gate;
   forming sidewall spacer on sidewall of said gate; and
   forming lightly doped drain region in said semiconductor substrate by titled angle ion implantation; and
   forming source and drain in said semiconductor substrate by ion implantation using said gate and spacer as masking.

11. The method of claim 10, wherein said dielectric layer comprises silicon oixde, silicon oxynitride, or silicon nitride.

12. The method of claim 10, wherein said barrier conductor comprises titanium nitride, tungsten, aluminum or copper.

13. The method of claim 10, wherein said metal layer comprises titanium.

14. The method of claim 10, wherein said titled angle ion implantation comprises LATIPS (large tilt-angle implanted punch-through stopper) technique.

* * * * *